(12) United States Patent
Chen

(10) Patent No.: US 6,476,439 B2
(45) Date of Patent: Nov. 5, 2002

(54) DOUBLE-BIT NON-VOLATILE MEMORY STRUCTURE AND CORRESPONDING METHOD OF MANUFACTURE

(75) Inventor: Chin-Yang Chen, Chilung (TW)

(73) Assignee: United Microelectronics Corp., Hsinchu (TW)

( * ) Notice: Subject to any disclaimer, the term of this patent is extended or adjusted under 35 U.S.C. 154(b) by 60 days.

(21) Appl. No.: 09/797,461

(22) Filed: Mar. 1, 2001

(65) Prior Publication Data

US 2002/0121657 A1 Sep. 5, 2002

(51) Int. Cl.[7] .............................................. H01L 29/72
(52) U.S. Cl. ...................... 257/315; 257/316; 257/321; 257/322; 257/390; 365/185.05; 365/185.11
(58) Field of Search .................................. 257/390, 315, 257/316, 321, 322; 365/185.05, 185.11

(56) References Cited

U.S. PATENT DOCUMENTS 6,344,994 B1 * 2/2002 Hamilton et al. ........... 257/390

* cited by examiner

*Primary Examiner*—Edward Wojciechowicz
(74) *Attorney, Agent, or Firm*—J.C. Patents

(57) ABSTRACT

A double-bit non-volatile memory structure and a method of forming the structure. The main body of the structure is an array of double-bit memory cells partitioned out by mutually crossing isolation lines and bit lines. Each memory cell includes a pair of stacked gate structures, a doped region in between the stacked gate structures and a pair of common source/drain regions for the pair of stacked gate structures. Each control gate within the pair of stacked gate structures connects electrically with a neighboring word line and each source/drain region connects electrically with a bit line. To form the structure, a plurality of isolation lines is formed over a substrate and then a plurality of linear multi-layered structures perpendicular to the isolation lines are formed over the isolation lines. A pair of neighboring linear multi-layered structures forms a grid unit. Thereafter, source/drain regions and bit lines are formed between various grid units. A plurality of doped region is formed in the substrate in the middle of each grid unit. The linear multi-layered structures are patterned to form an array of stacked gate structures. Each pair of neighboring stacked gate structures forms a double-bit memory cell. Finally, words lines that are perpendicular to the bit lines are formed over the stacked gate structures.

14 Claims, 17 Drawing Sheets

DOUBLE-BIT NON-VOLATILE MEMORY STRUCTURE AND CORRESPONDING METHOD OF MANUFACTURE

BACKGROUND OF THE INVENTION

1. Field of Invention

The present invention relates to a semiconductor device structure and a method of manufacturing the structure. More particularly, the present invention relates to a double-bit non-volatile memory (NVM) structure and a method of manufacturing the structure.

2. Description of Related Art

Non-volatile memory (NVM) is a type of fast access, miniature, power-saving, vibration-resistant and permanent storage media. Thus, the applications of NVM are wide. A prominent type of NVM is the flash memory. One prominent feature of the flash memory is the capacity for block-by-block data erasure so that time is saved.

FIG. 1 is a schematic cross-sectional view showing the structure of a conventional non-volatile memory cell. As shown in FIG. 1, the non-volatile memory cell includes a stacked gate structure 110 over a substrate 100 with a source/drain region 120 in the substrate 100 on each side of the stacked gate structure 110. The stacked gate structure 110 further includes, from bottom to top, a tunnel oxide layer 112, a floating gate 114, an inter-gate dielectric layer 116 and a control gate 118. During programming, electrons are injected into the floating gate 114. To erase data, a high negative bias voltage is applied to the control gate 118 and hence electrons are channeled away from the floating gate 114.

However, in order to remove all electrons from the floating gate 114, over-erasure of the aforementioned non-volatile memory cell often occurs. In other words, too many electrons may be forced out of the floating gate 114 during erasure and result in the accumulation of positive charges in the floating gate 114. In the presence of excess positive charges, an inversion of the channel underneath the floating gate 114 may occur and ultimately may lead to the channel being permanently open and possible data read errors.

To resolve the issue, a split gate structure has been developed. FIG. 2 is a schematic cross-sectional view of a non-volatile cell having a conventional split-gate structure. As shown in FIG. 2, a split-gate structure 210 is formed over a substrate 200 with a source/drain region 220 in the substrate 200 on each side of the split gate structure 210. The split-gate structure 210 includes, from bottom to top, a tunnel oxide layer 212, a floating gate 214, an inter-gate dielectric layer 216, a control gate 218 and a transfer gate 218a. The transfer gate 218a extends from the control gate 218 to the side of the floating gate 214. In this type of design, the channel under the transfer fate 218a is open up only when a voltage is applied to the control gate 218 and the transfer gate 218a. Hence, even if the channel underneath the floating gate 214 is opened due to over-erasure, the two source/drain regions 220 of the memory cell are still in a non-conductive state, thereby preventing data errors.

Although the split-gate structure 210 is able to prevent data errors due to over-erasure, the design has an adverse effect on miniaturization. This is because the transfer gate 218a requires extra area. In addition, the combined widths of the control gate 218 and the transfer gate 218a inside the split-gate structure 210 are different from that of the floating gate 214. The floating gate 214 and the control gate 218/the transfer gate 218a pair must be patterned by applying a photolithographic process twice. Consequently, errors in the overlapping area between the floating gate 214 and control gate 218/transfer gate 218a pair may occur leading to possible non-uniform memory cell properties. Ultimately, electrical performance of each memory cell may be different and may result in some difficulties in controlling the memory cells.

SUMMARY OF THE INVENTION

Accordingly, one object of the present invention is to provide a double-bit non-volatile memory structure having a configuration similar to a flash memory. Each bit of the memory requires an area smaller than a split-gate design and the structure is capable of preventing over-erasure. The structure includes a substrate, a plurality of isolation layers, a plurality of bit lines, a plurality of stacked gate structures, a plurality of doped regions, a plurality of source/drain regions and a plurality of word lines. The isolations layers are formed over the substrate parallel to each other. The bit lines run in a direction perpendicular to the isolation layers and enclose a grid-like unit array. The connecting line between a pair of stacked gate structures within each grid-like unit array is parallel to the isolation layers. Each stacked gate structure includes a floating gate and a control gate above the floating gate. Each doped region is formed in the substrate in the area between neighboring stacked gate structures within a grid-like unit. The source/drain regions are formed in the substrate in areas between neighboring gridlike unit. The source/drain regions and the doped regions are doped identically. The word lines are formed above the stacked gate structures and perpendicular to the bit lines. The two control gates within each grid-like unit are connected electrically to a word line on each side, respectively.

This invention also provides a method of manufacturing a double-bit non-volatile memory having the structure according to this invention. First, isolation layers are formed over a substrate and then a multi-layered structure is formed over the substrate. The multi-layered structure includes, from bottom to top, a tunnel layer, a first conductive layer, an inter-gate dielectric layer and a second conductive layer. The multi-layered structure is patterned to form a plurality of linear multi-layered strips running in a direction perpendicular to the isolation layers. Furthermore, each pair of neighboring linear multi-layered strips defines a linear unit. Source/drain regions and bit lines are formed in the substrate within each linear unit. In addition, a plurality of doped regions is formed between the linear multi-layered strips within each linear unit. The source/drain regions and the doped regions are doped identically. The bit lines and the isolation layers together enclose a plurality of grid-like units. In a subsequent step, various linear multi-layered strips are patterned to form a plurality of stacked gate structures so that each grid-like unit has a pair of stacked gate structures. Each stacked gate structure comprises a floating gate constructed from the first conductive layer and a control gate constructed from the second conductive layer. A plurality of word lines is formed above the stacked gate structures and perpendicular to various bit lines. The pair of control gates inside each grid-like unit is electrically connected to the respective word line on each side.

In the aforementioned method of manufacturing a double-bit non-volatile memory structure, two methods can be used to form the bit lines. One method is to form buried bit lines while the other is to form over the source/drain regions running across the isolation layers.

In addition, the pair of stacked gate structures within a grid-like unit, the doped region between the stacked gate structures of the grid-like unit and the pair of source/drain regions on each side of the grid-like unit together form a memory cell. The control gates of the pair of stacked gate structures within the grid-like unit are electrically connected to the respective word lines on each side of the grid-like unit. The pair of source/drain regions is similarly connected to a pair of neighboring bit lines. Both the source/drain regions and the doped region between the pair of stacked gate structures are doped identically.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
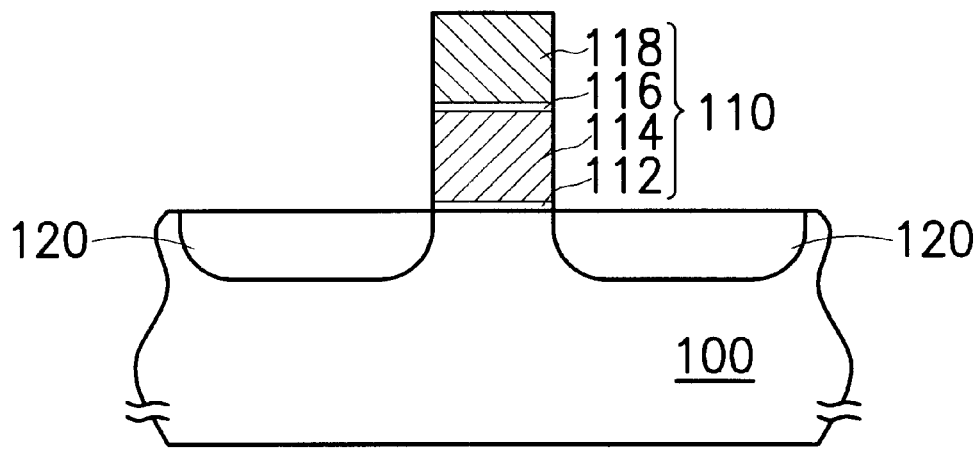
FIG. 1 is a schematic cross-sectional view showing the structure of a conventional non-volatile memory cell.

Reference will now be made in detail to the present preferred embodiments of the invention, examples of which are illustrated in the accompanying drawings. Wherever possible, the same reference numbers are used in the drawings and the description to refer to the same or like parts.

FIGS. 3 through 11 (or FIGS. 3 through 10 & 12) are schematic cross-sectional views showing the progression of steps for fabricating a double-bit non-volatile memory structure using a first method of forming the word lines according to a first preferred embodiment of this invention. FIGS. 3A, 5A, 6A, 7A, 9A, 11A, 12A are the respective top views of the structure shown in FIGS. 3, 5, 6, 7, 9, 11 and 12. FIG. 11B is a cross-sectional view along line V–V' of FIG. 11A and FIG. 12B is a cross-sectional view along line II–II' of FIG. 12A.

Figure 11:
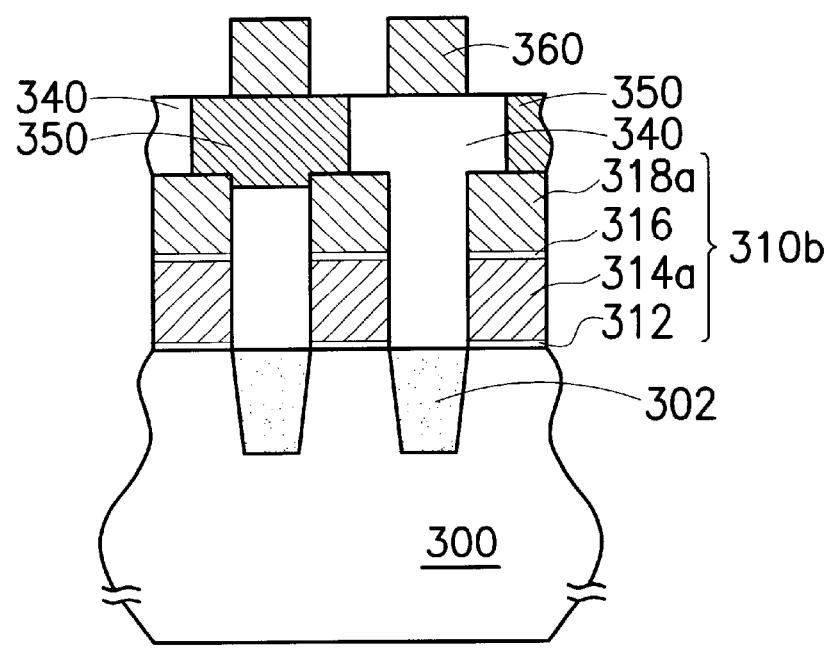
Figure 11B:
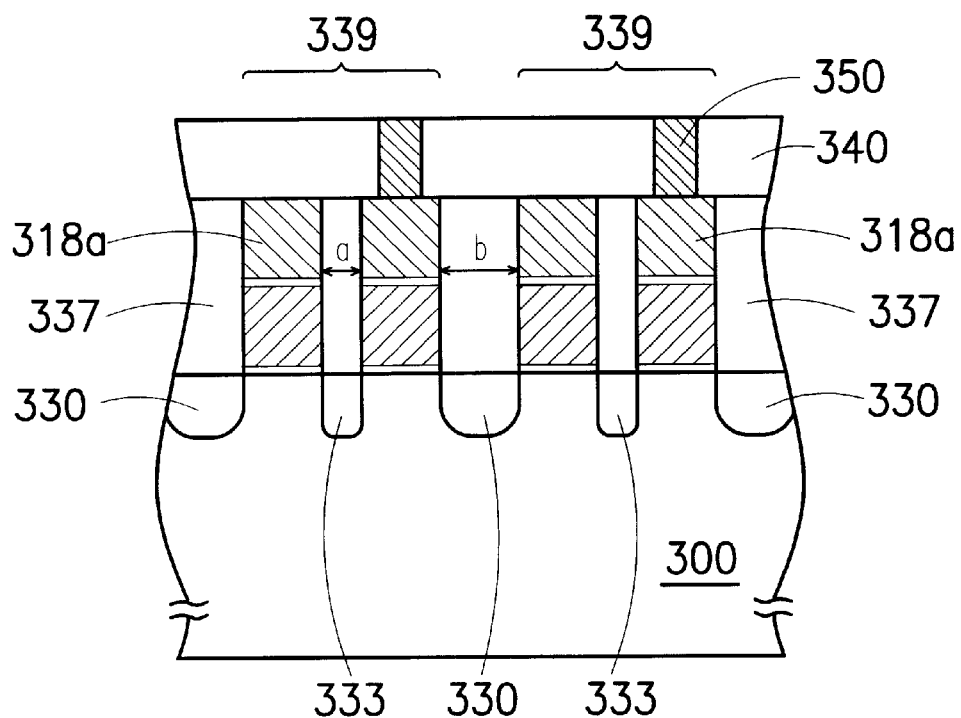
FIG. 11B is a cross-sectional view along line V–V' of FIG. 11A.
Figure 11A:
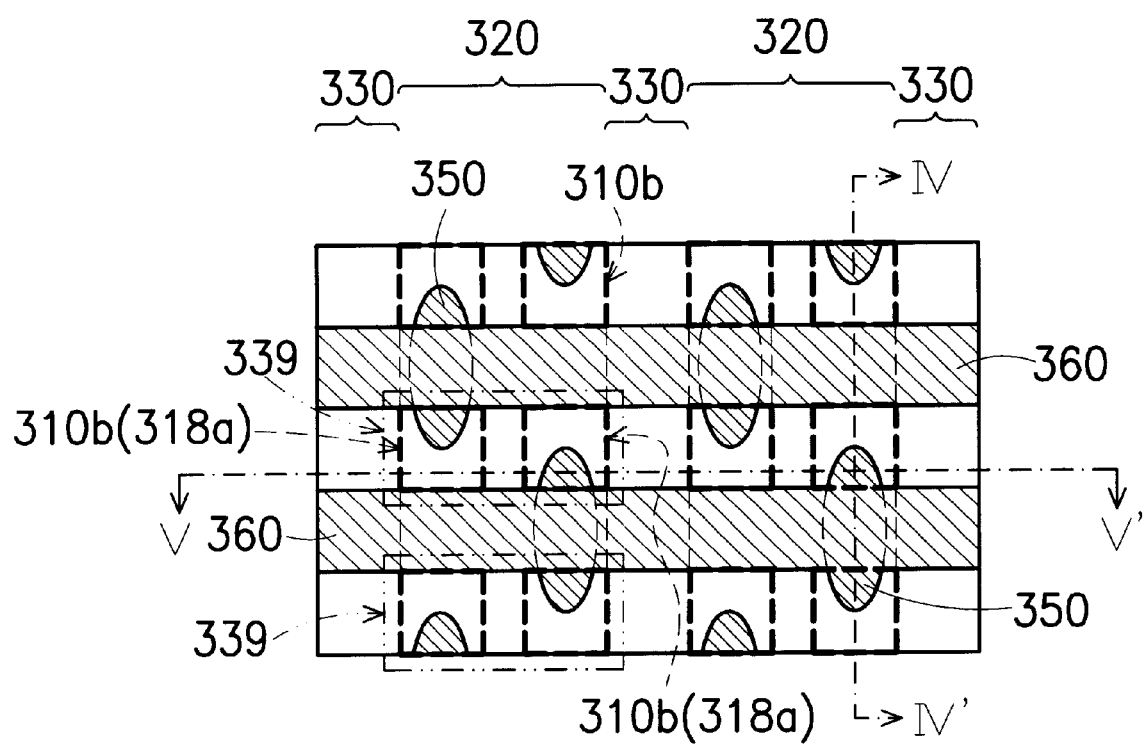
Figure 12:
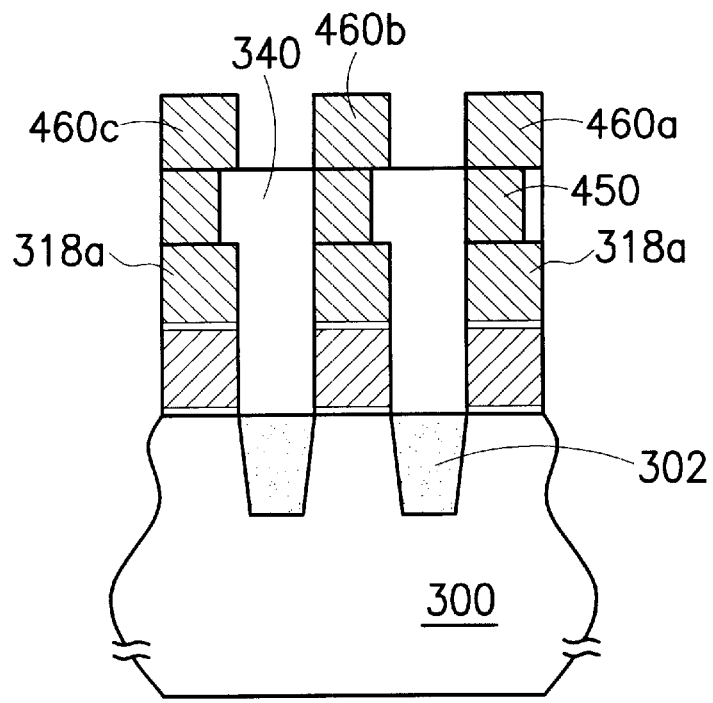
FIG. 12 is a schematic cross-sectional view showing the structure of a double-bit non-volatile memory structure fabricated using a second method of forming the word lines according to the first preferred embodiment of this invention.
Figure 12B:
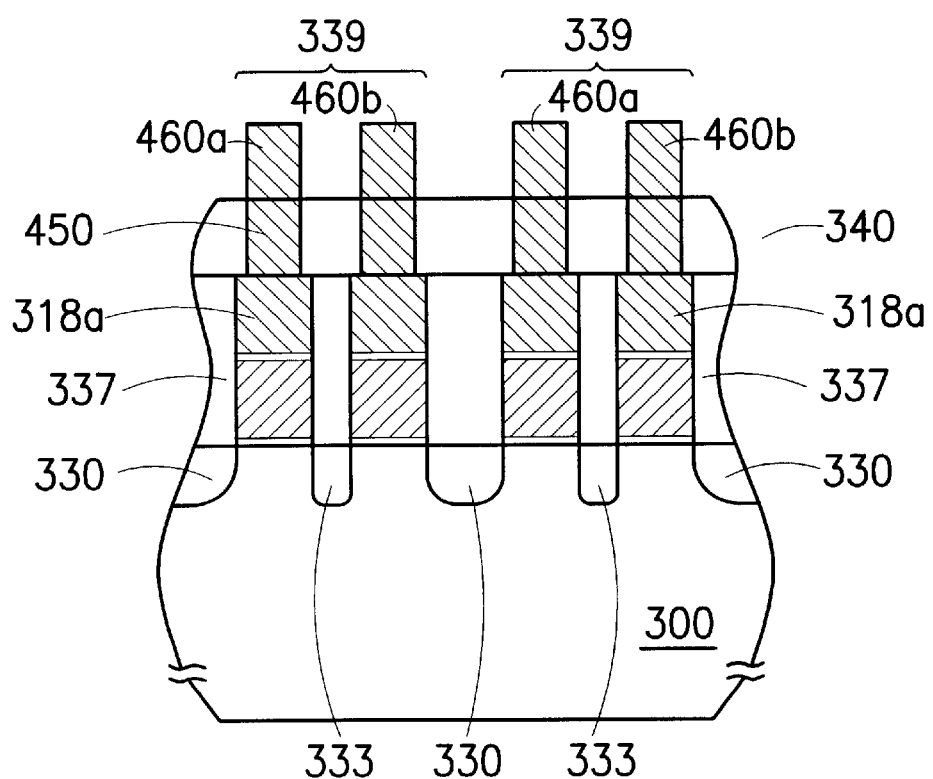
FIG. 12B is a cross-sectional view along line II–II' of FIG. 12A.
Figure 12A:
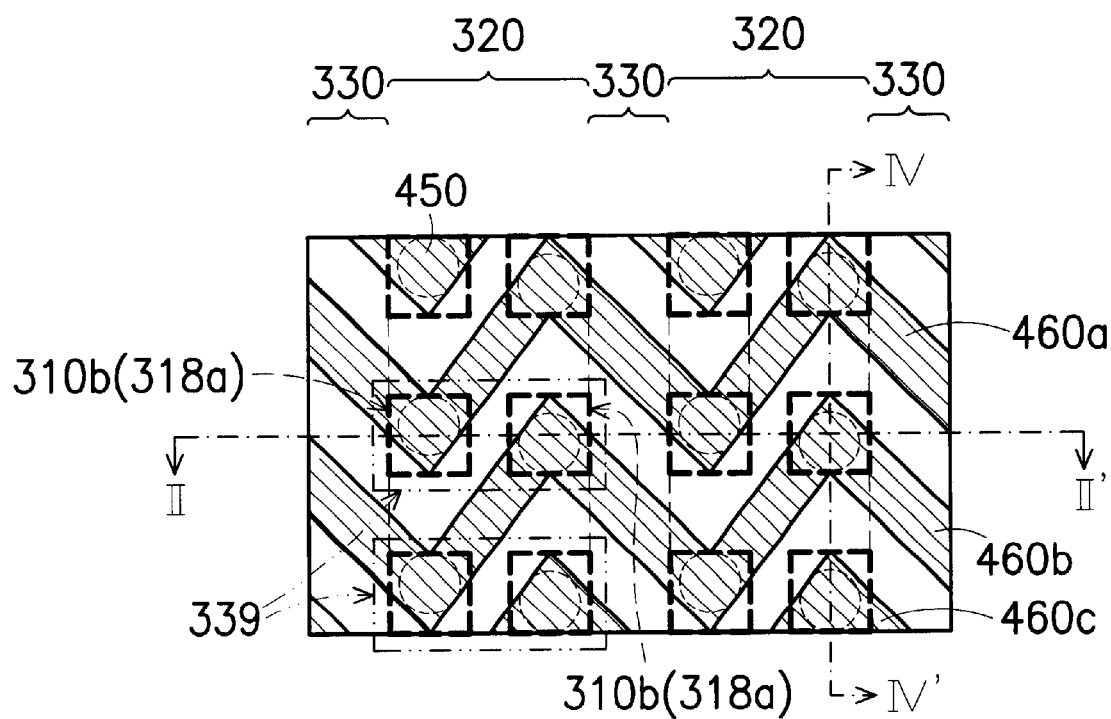

In addition, FIGS. 11A, 11 and 11B form a group showing a first method of forming the word lines according to the first embodiment. FIGS. 12A, 12 and 12B form another group showing a second method of forming the word lines according to the first embodiment.

Figure 3A:
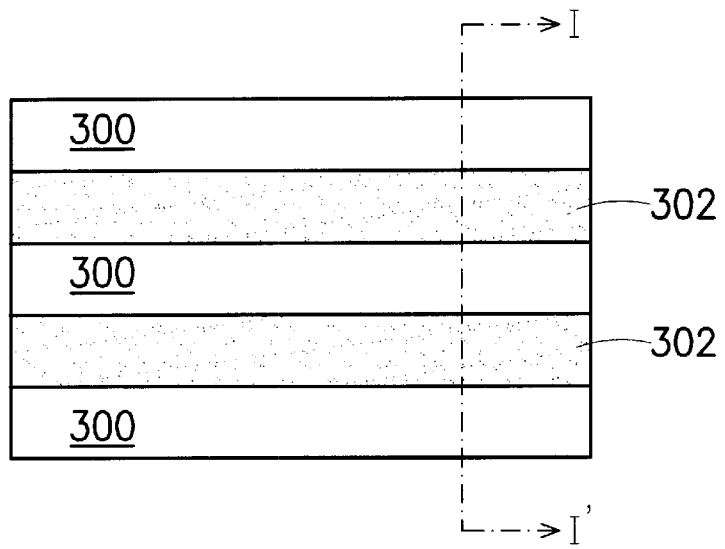
FIGS. 3A, 5A, 6A, 7A, 9A, 11A, 12A are the respective top views of the structure shown in FIGS. 3, 5, 6, 7, 9, 11 and 12.
Figure 3:
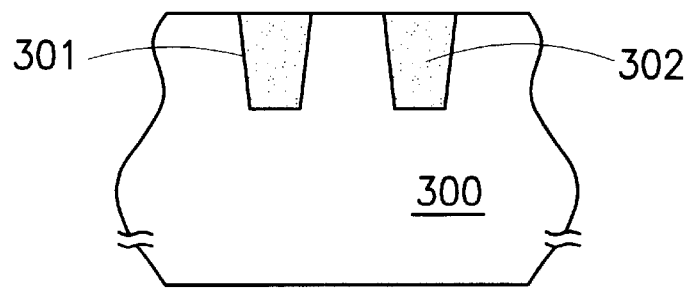
FIGS. 3 through 11 are schematic cross-sectional views showing the progression of steps for fabricating a double-bit non-volatile memory structure using a first method of forming the word lines according to a first preferred embodiment of this invention.

As shown in FIGS. 3 and 3A (FIG. 3 is a cross-sectional view along line I–I' of FIG. 3A), parallel shallow trench isolation (STI) structures 302 are formed in a substrate 300. The STI structures are formed inside trenches 301 each having a pair of slanted sidewalls.

Figure 4:
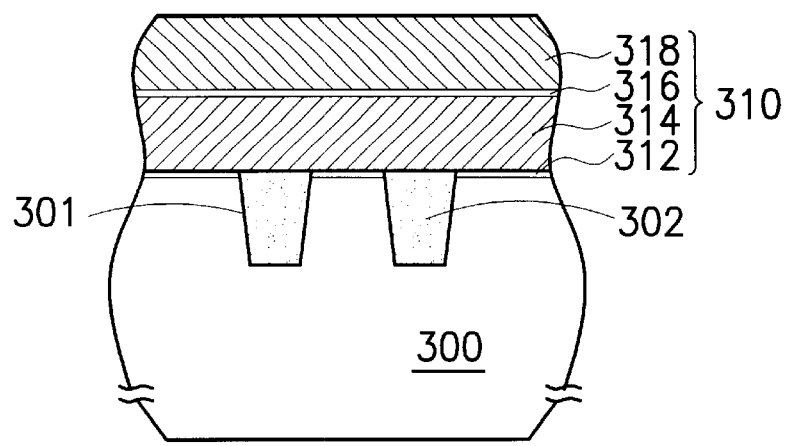

As shown in FIG. 4 (FIG. 4 is on the same cross-sectional surface as FIG. 3), a tunnel oxide layer 312, a conductive layer 314, an inter-gate dielectric layer 316 and a conductive layer 318 are sequentially formed over the substrate 300. Here, the tunnel oxide layer 312, the conductive layer 314, the inter-gate dielectric layer 316 and the conductive layer 318 together are grouped together and referred to as a multi-layered structure 310. The conductive layers 314 and 318 can be polysilicon layers, for example. The inter-gate dielectric layer 316 can be a composite layer, for example, an oxide/nitride/oxide (ONO) layer.

Figure 5A:
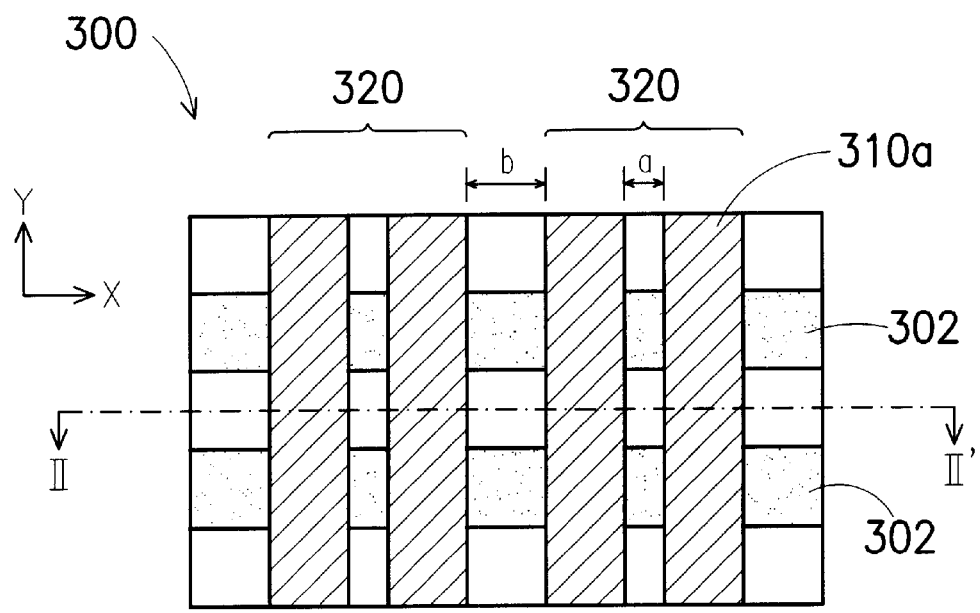
Figure 5:
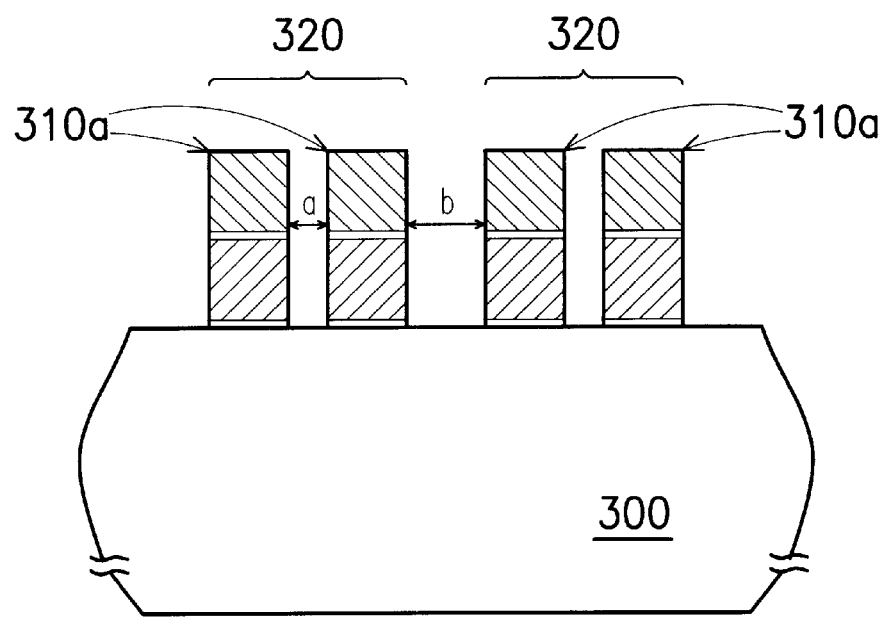

As shown in FIGS. 5A and 5 (FIG. 5 is a cross-sectional view along line II–II' of FIG. 5A), the multi-layered structure 310 is patterned to form Y-directional linear multi-layered structures 310a. Each pair of neighboring linear multi-layered structures 310a constitutes a linear unit 320. In addition, distance 'a' between the linear multi-layered structure 310a within each pair of linear unit 320 is smaller than distance 'b' between the respective linear multi-layered structure 310a of a neighboring pair of linear unit 320.

Figure 6A:
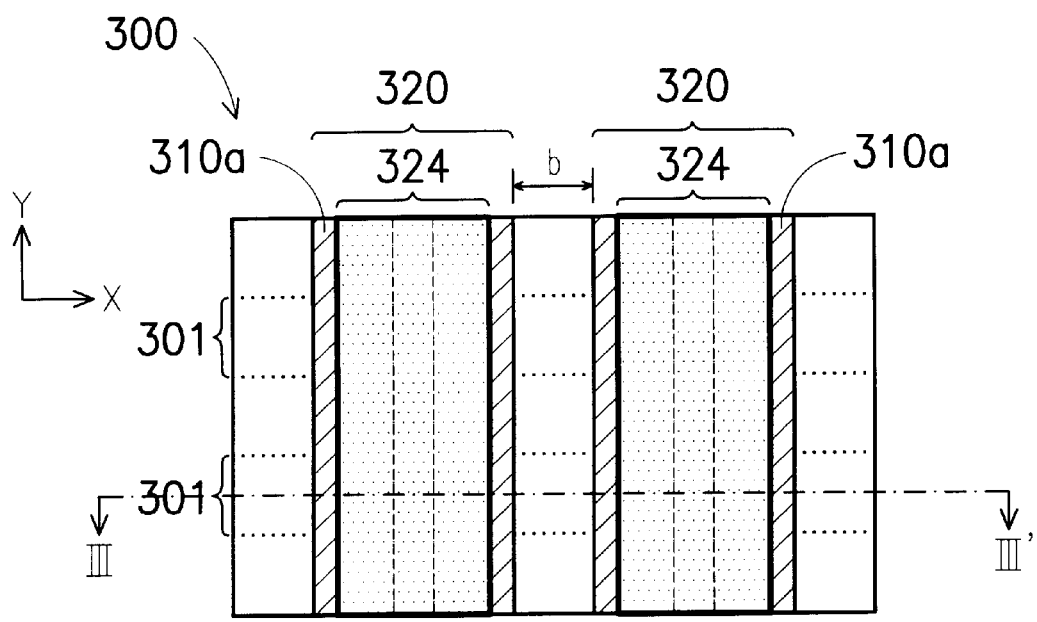
Figure 6:
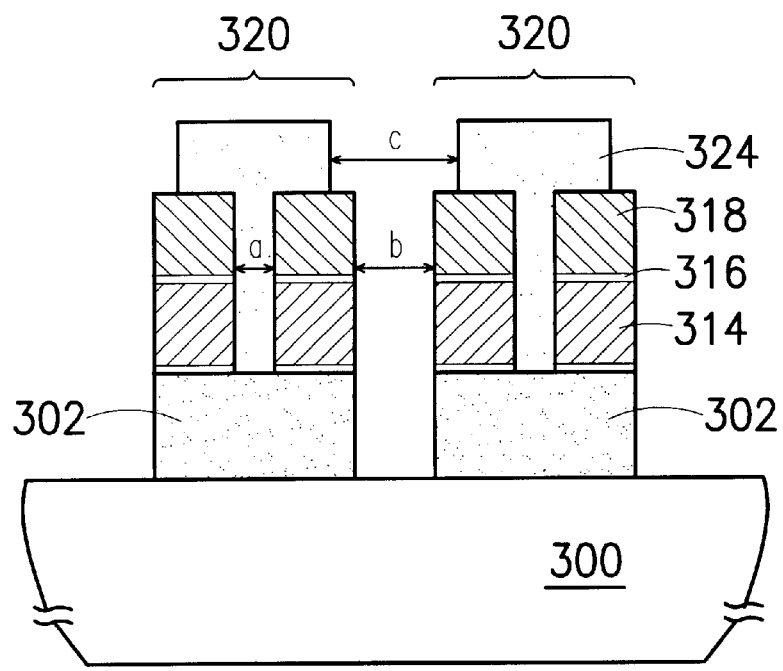

As shown in FIGS. 6A and 6 (FIG. 6 is a cross-sectional view along line III–III' of FIG. 6A), a patterned mask layer 324 is formed over the substrate 300. The mask layer 324 can be a photoresist layer. The mask layer 324 exposes the STI structures 302 between various linear units 320. Using the mask layer 324 as an etching mask, the exposed STI structure 302 is removed. The process can be carried out using a self-aligned source (SAS) method, for example. In other words, width 'c' of the opening in the mask layer 324 is greater than the distance 'b' between neighboring pair of line units 320 so that a better alignment is obtained.

Figure 7A:
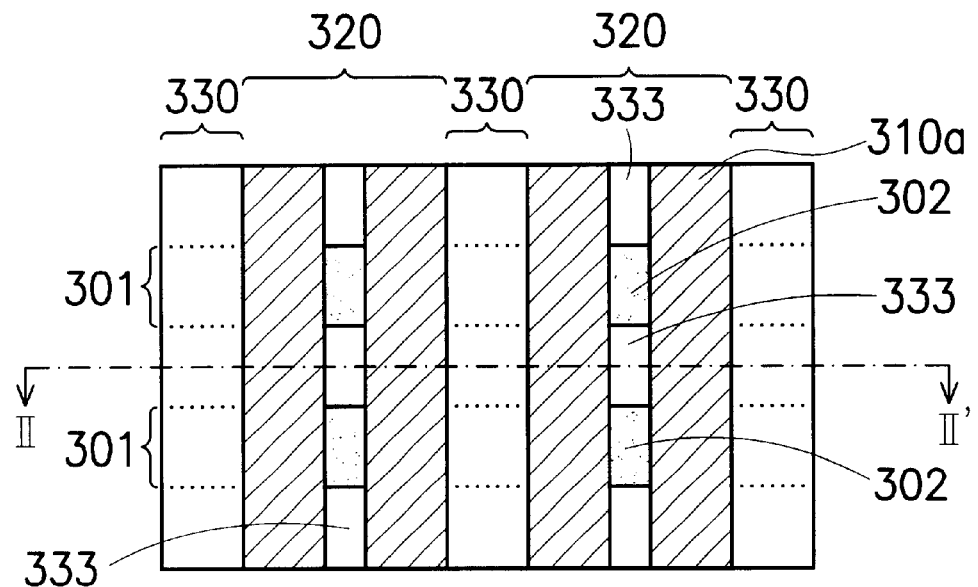
Figure 7:
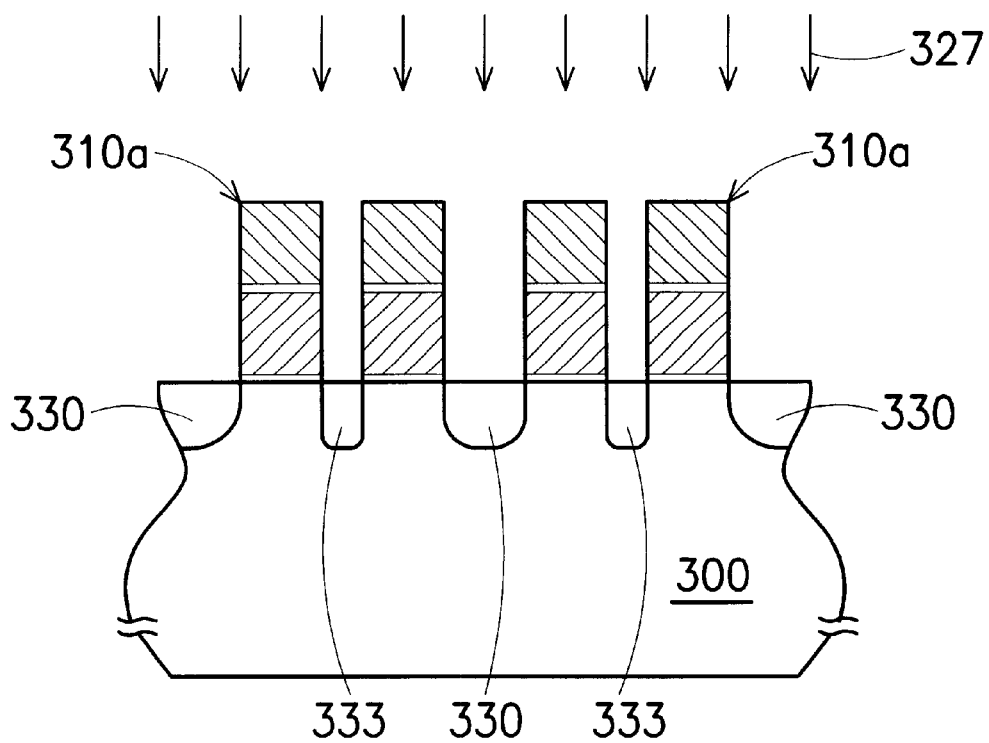

As shown in FIGS. 7A and 7 (FIG. 7 is a cross-sectional view along line II–II' of FIG. 7A), the mask layer 324 is removed. Using the linear multi-layered structures 310a and the STI structures 302 as a mask, an ion implantation 327 is conducted. In ion implantation 327, n-type ions are implanted into the substrate 300 in regions between the linear multi-layered structures 310a within each linear unit 320 to form doped regions 333. In the meantime, buried bit lines 330 are also formed in the substrate 300 in regions between various linear units 320. A portion of the buried bit line 330 lies on the substrate 300 within the trench 301. The boundaries of the trench 301 are marked out by dotted lines. As shown in FIG. 7, the bit lines 330 serve as the source/drain regions of various devices. In addition, due to the presence of slanting sidewalls on all trench sidewalls as shown in FIGS. 3, 7 and 7A, doped regions 333 are formed after the ion implantation 327. The doped regions 333 serve as a portion of the bit lines 330.

Figure 8:
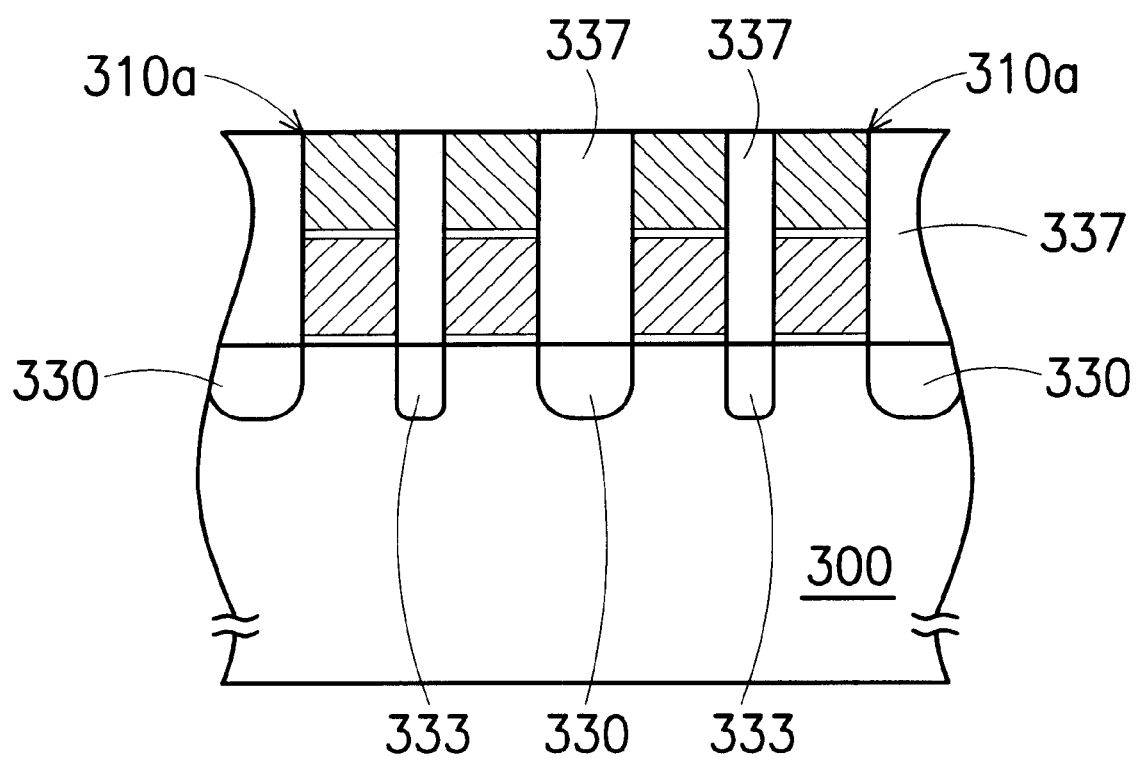

As shown in FIG. 8, the space between various linear multi-layered structures 310a is filled by forming a dielectric layer 337. The dielectric layer 337 is formed, for example, by depositing dielectric material to fill the space between various linear multi-layered structures 310a, and then removing excess dielectric material by performing chemical-mechanical polishing (CMP). The dielectric layer 337 can be a silicon oxide layer formed, for example, by chemical vapor deposition (CVD).

Figure 9A:
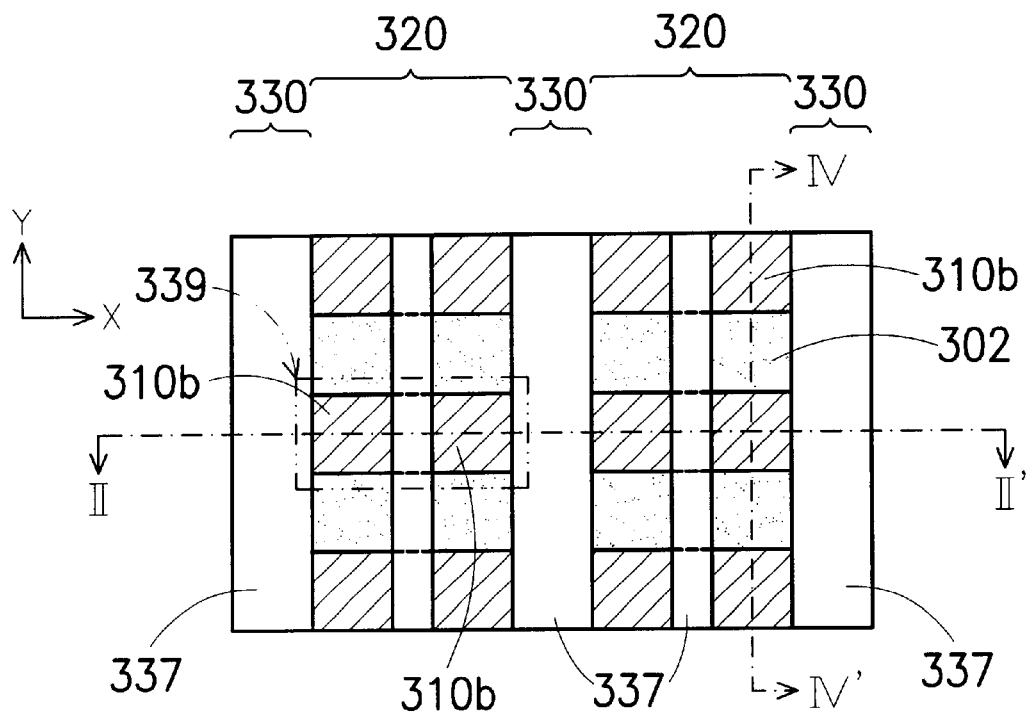
Figure 9:
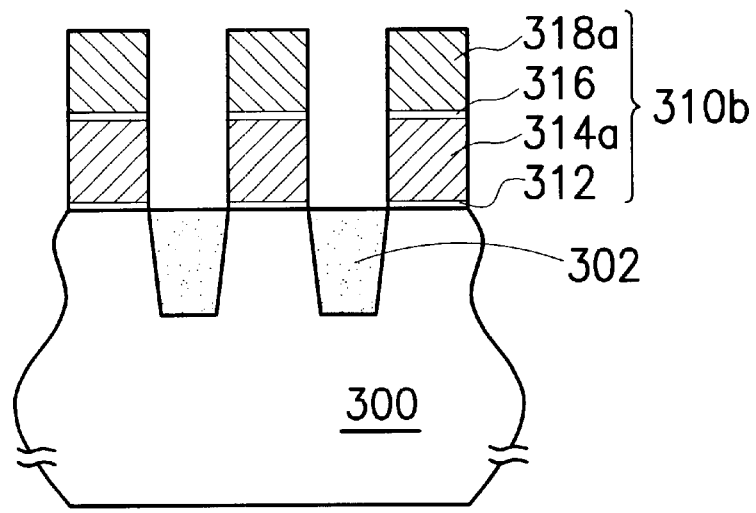

As shown in FIGS. 9A and 9 (FIG. 9 is a cross-sectional view along line IV–IV' of FIG. 9A), the linear multi-layered structures 310a are patterned. The Y-directional linear multi-layered structures 310a are partitioned into a plurality of stacked gate structures 310b. Each stacked gate structure includes, from bottom to top, the tunnel oxide layer 312, a floating gate 314a obtained from the conductive layer 314, the inter-gate dielectric layer 316 and a control gate 318a obtained from the conductive layer 318. As shown in FIG. 9A, a pair of stacked gate structures 310b within a linear unit 320 constitutes a memory cell 339 and each memory cell 339 is capable of holding two bits of data. As shown in FIG. 8 and FIG. 9A (FIG. 8 can be regarded as a cross-sectional view along line II–II' of FIG. 9A, only the labels are slightly different (310b and 310a)), each memory cell 339 also includes a doped regions 333 in the substrate 300 between the pair of stacked gate structures 310b within the memory cell 339.

Figure 10:
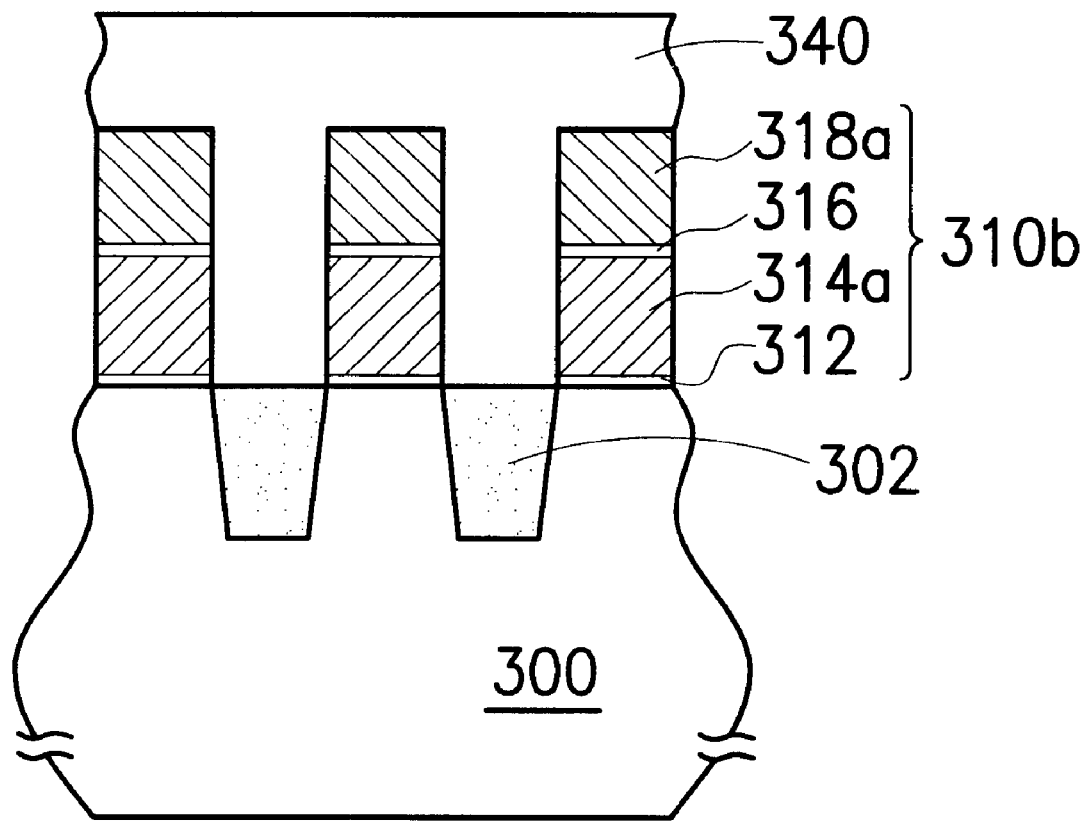

As shown in FIG. 10 (FIG. 10 corresponds to the same cross-section shown in FIG. 9) and FIGS. 9A and 9, a dielectric layer 340 is formed over the substrate 300. The dielectric layer 340 fills any cavities formed by various stacked gate structures 310b and dielectric layers 337.

In the subsequent steps, vias are formed in the dielectric layer 340 for linking the control gates 318a of various stacked gate structures 310b. Word lines are next formed in a direction perpendicular to the bit lines 330 for connecting electrically with various vias. There are two principle methods of forming the word lines. However, one common aspect is that the two control gates 318a (refer to FIGS. 9A and 9) within the same memory cell 339 must be electrically connected to two neighboring word lines.

FIGS. 11A, 11 and 11B are diagrams illustrating a first method of forming vias and word lines according to the first embodiment of this invention. FIG. 11 is a cross-sectional view along line IV–IV' of FIG. 11A and FIG. 11B is a cross-sectional view along line V–V' of FIG. 11A.

As shown in FIGS. 11 and 11A, unlanded vias 350 are formed in the dielectric layer 340. A word line 360 (shown in FIG. 11A) connecting with all the unlanded vias 350 along a horizontal row is formed over the dielectric layer 340 perpendicular to the bit lines 330. Each unlanded via 350 is electrically connected to a pair of neighboring control gates 318a. The pair of control gates 318a located within a linear unit 320 belongs to two neighboring memory cells 339. The two control gates 318a within a memory cell 339 are electrically connected to the unlanded via 350 on two different rows so that they are electrically connected to two different word lines 360.

In addition, as shown in FIGS. 11A and 11B, any word line 360 is electrically connected to the control gate 318a of a memory cell 339 on one side only. Each control gate 318a that connects electrically with a particular word line 360 is located on the same side of the memory cell 339 (the right side in FIGS. 11A and 11B). However, as long as any one of the word lines 360 that passes pairs of 'neighboring and the memory cell 339 within the same linear unit 320' is electrically connected to a pair of neighboring control gates 318a and the unlanded via 350 under the word line 360 is electrically connected according to the aforementioned criteria, other arrangements are also satisfactory. Moreover, all control gates 318a that connect to the same word line 360 can be positioned on different sides of the memory cells 339.

FIGS. 12A, 12 and 12B are diagrams illustrating a second method of forming vias and word lines according to the first embodiment of this invention. FIG. 12 is a cross-sectional view along line IV–IV' of FIG. 12A and FIG. 12B is a cross-sectional view along line II–II' of FIG. 12A.

As shown in FIGS. 12A, 12 and 12B, a via 450 (circles formed by dashed lines in FIG. 12A) is formed in the dielectric layer 340 above each control gate 318a. Here, only the landed via is shown. However, a slight misalignment is possible. As shown in FIGS. 12A and 12, sawtooth-shaped word lines 460a/b/c having an overall running direction perpendicular to the bit lines 330 are formed over the dielectric layer 340.

Each word line 460a/b/c is electrically connected to a via 450 above one of the control gate 318a of a neighboring memory cell 339. Moreover, a pair of neighboring vias connected by the same word line 460a/b/c lies at the diagonal corner of a square. In other words, for a pair of neighboring memory cells 339 within a linear unit 320, only a pair of diagonally positioned control gates 318a is electrically connected through a word line 460a/b/c.

In addition, as shown in FIG. 12B, the word line 460a/b/c is electrically connected to only one of the control gates 318a along its path and each control gate 318a connected to same word line 460a/b/c falls on the same side of the memory cell 339. However, as long as a pair of memory cells 339 within the same linear unit 320 only has a pair of diagonally positioned control gates 318a connected to the same word line 460a/b/c and each via 450 only connects electrically to a control gate 318a, other types of arrangement are feasible. Hence, the control gates 318a that are electrically connected to the same word line 460a/b/c can be positioned on different sides of their respective memory cells 339.

This invention also provides a second embodiment. The second embodiment is very similar to the first embodiment except that the method of manufacturing the bit lines is different. To shorten explanation, a detailed explanation of the first stage manufacturing processes is omitted (refer back to FIGS. 3A, 3 and 4 and the aforementioned description).

Figure 13A:
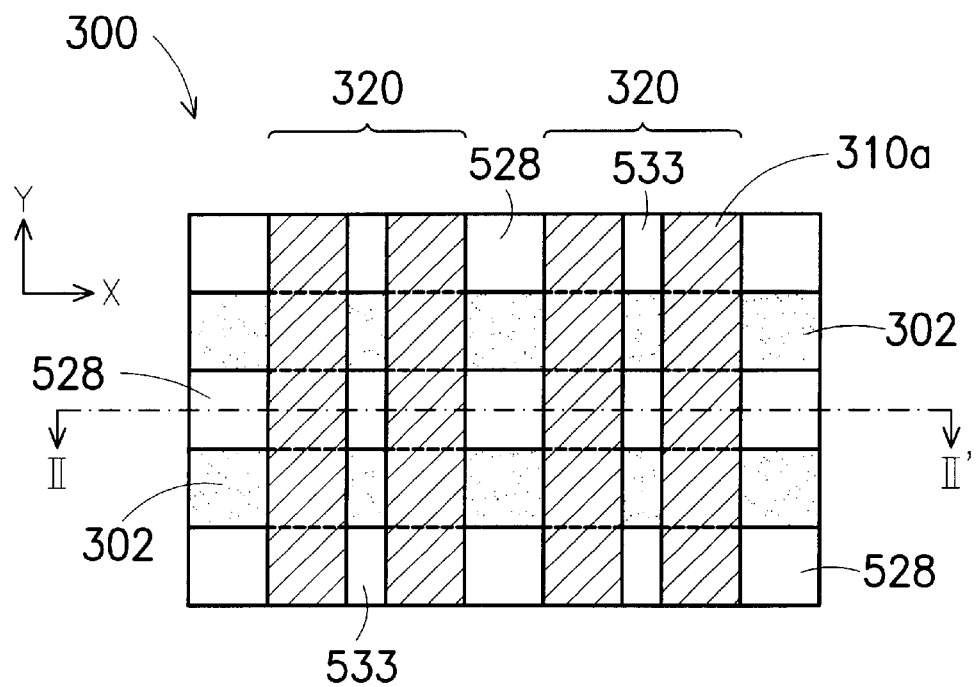
FIGS. 13A and 14A are respective top views of the sectional views in FIGS. 13 and 14.
Figure 13:
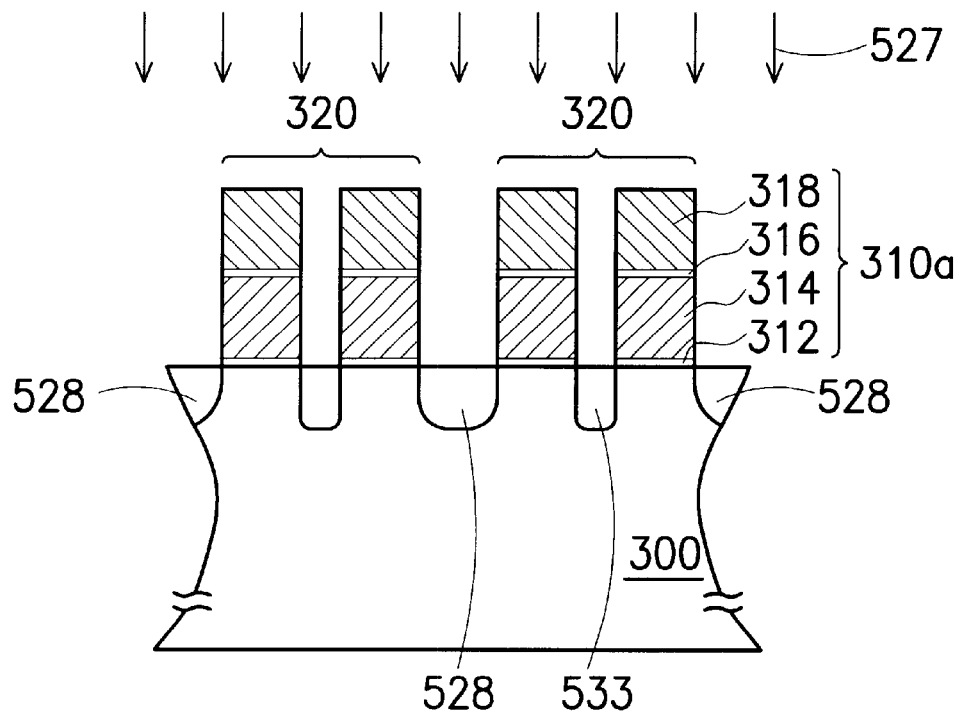
FIGS. 13 to 15 are schematic cross-sectional views showing the progression of steps for forming the source/drain region and the bit lines of a double-bit non-volatile memory structure according to a second preferred embodiment of this invention, wherein the process shown in FIG. 13 is a continuation of the steps for forming a multi-layered structure (corresponding to FIG. 4 in the first embodiment), and the steps for patterning the stacked gate structure (corresponding to FIGS. 9A and 9 in the first embodiment) follow after the process shown in FIG. 15.

FIGS. 13A and 13 are a continuation of the steps following the process illustrated in FIG. 4. FIG. 13 is a cross-sectional view along line II–II' of FIG. 13A. As shown in FIGS. 13 and 13A, after the formation of the multi-layered structures 310a, an ion implantation 527 is carried out using the linear multi-layered structures 310a and the STI structures 302 as a mask so that a plurality of doped regions 533 is formed in the substrate 300 between the pair of linear multi-layered structures 310a within each linear unit 320. The doped regions 533 are separated by the STI structures 302. A plurality of source/drain regions 528 is also formed in the substrate 300 between various linear units 320. The source/drain regions 528 are similarly separated by the STI structures 302.

Figure 14A:
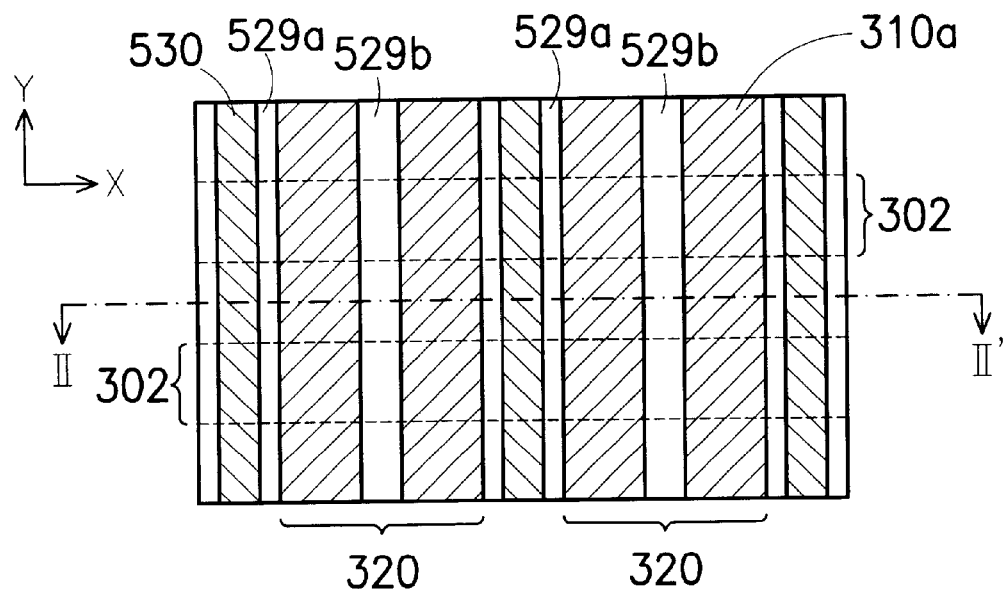
Figure 14:
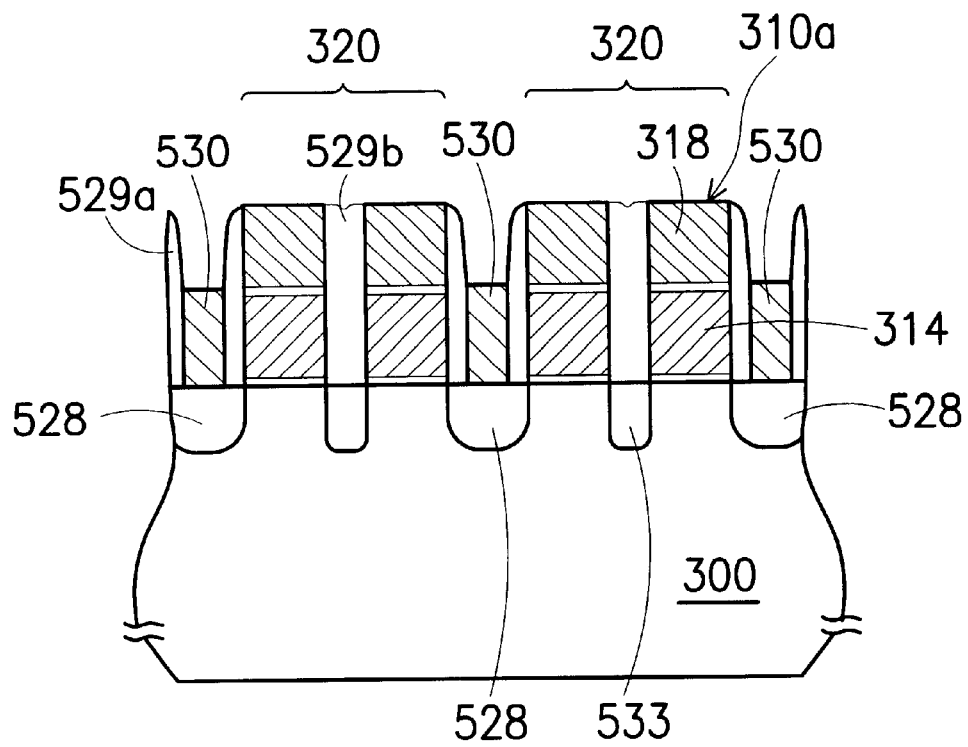

As shown in FIGS. 14A and 14 (FIG. 14 is a cross-sectional view along line II–II' of FIG. 14A), dielectric spacers 529a are formed on the sidewalls of the linear multi-layered structures 310a within each linear unit 320 to isolate the conductive layer 314 and the conductive layer 318 within the linear multi-layered structures 310a. A dielectric material 529b identical to the one used for forming the dielectric spacers 529a is used to fill the small space between the linear multi-layered structures 310a within each linear unit 320 (compare with corresponding FIG. 5A in the first embodiment, the width is 'a' whose value is smaller than 'b'—the distance between neighboring linear unit 320). Thereafter, conductive material is deposited into the space between the spacers 529a on the sidewalls of the linear units 320 to form bit lines 530 that cross over the STI structures 302. The bit lines 530 can be made using polysilicon or metallic material, for example. The upper surfaces of the bit lines 530 are below those of the linear multi-layered structures 310a.

Figure 15:
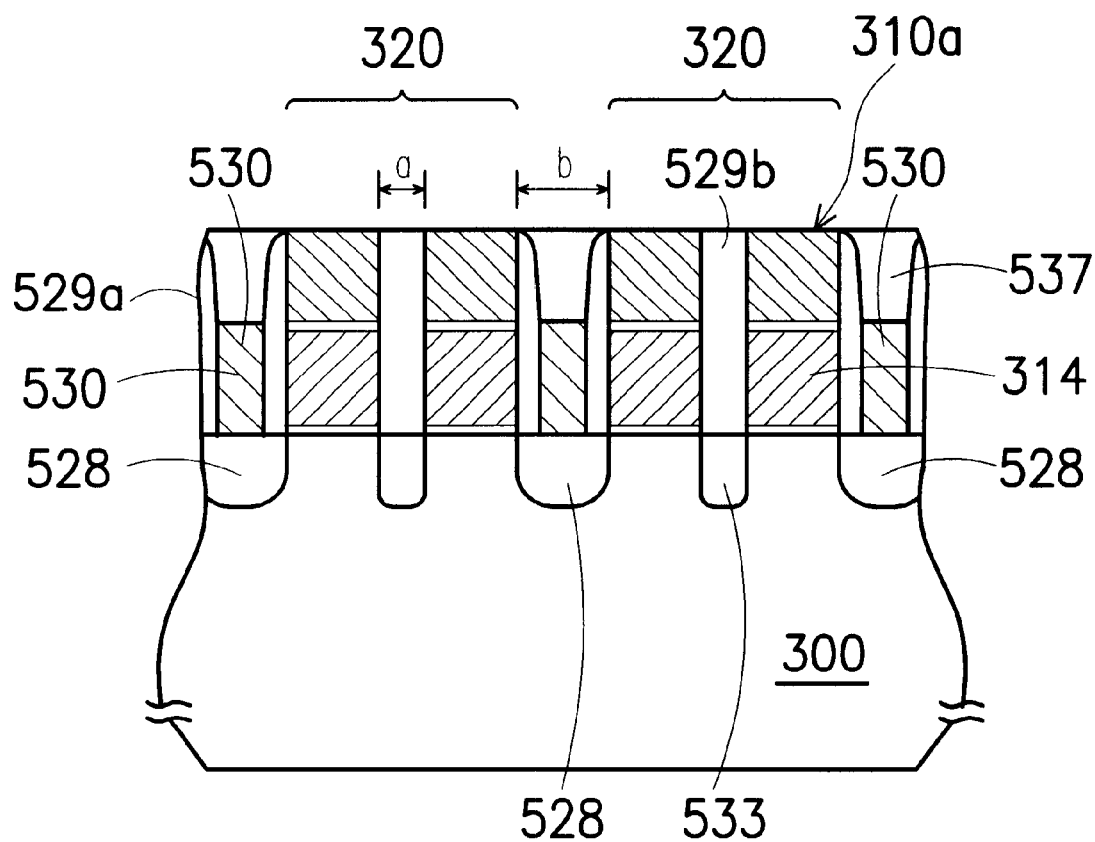

As shown in FIG. 15, a dielectric layer 537 is formed over the bit lines 530 so that all the space between the spacers 529a on the sidewalls of various linear units 320 is filled. Hence, the bit lines 530 are well protected. The dielectric layer 537 can be a silicon oxide layer formed, for example, by chemical vapor deposition (CVD).

In the subsequent step, the only difference between the first embodiment and the second embodiment is the presence or absence of the spacers 529a and the configuration of the bit lines. Since the subsequent steps of patterning the various linear multi-layered structures 310a to form the stacked gate structures 310b and the two methods of forming the via/word lines in the second embodiment of this invention have already been described with reference to the top views shown in FIGS. 9A, 11A, 12A, the cross-sectional views shown in FIGS. 9 to 12 and the cross-sectional views shown in FIGS. 11B, 12B, no further elaboration of details is necessary here.

Figure 16:
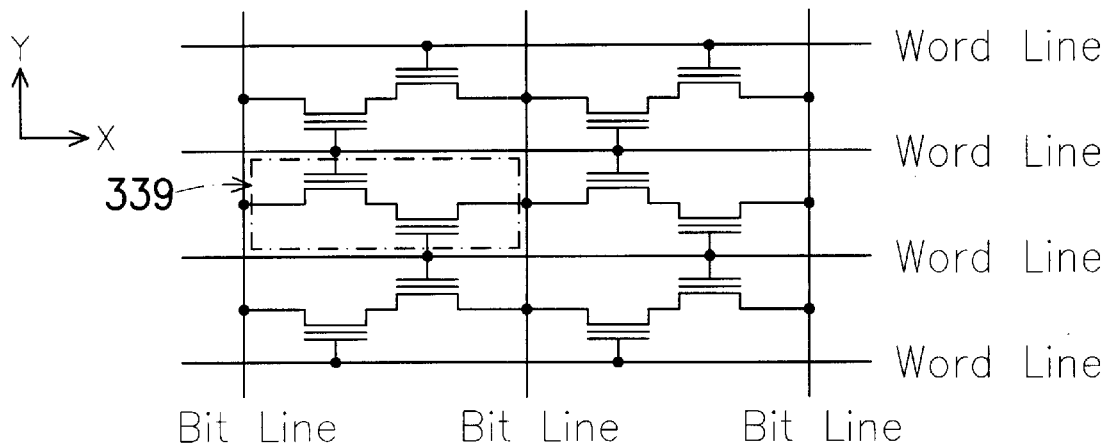
FIGS. 16 and 17 are the respective circuit diagrams of a double-bit non-volatile memory structure formed by a first and a second word line fabrication method.
Figure 17:
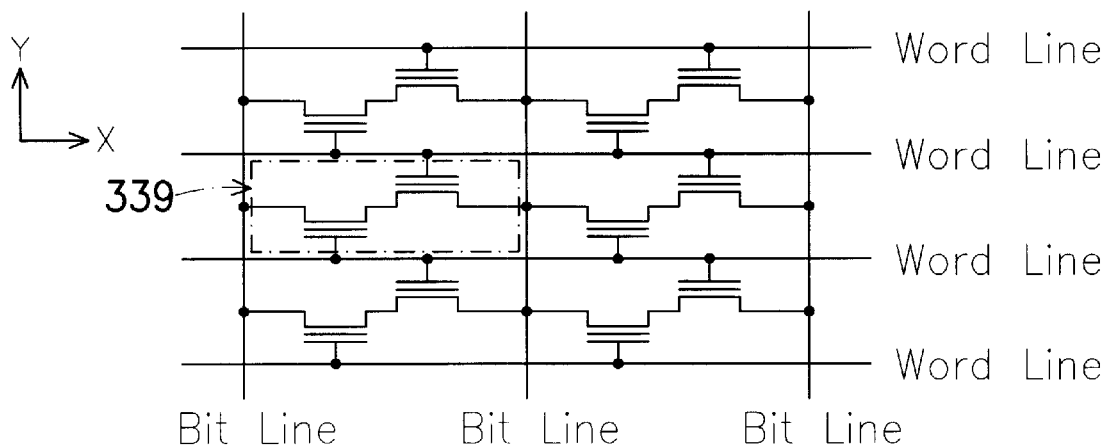

FIGS. 16 and 17 are the respective circuit diagrams of a double-bit non-volatile memory structure formed by a first and a second word line fabrication method. As shown in FIG. 16, among the two neighboring memory cells 339 in the Y-direction, only one pair of control gates with the same X coordinates is electrically connected to an identical word line. The other two control gates are electrically connected to the respective word lines on each side of the particular word line. On the other hand, as shown in FIG. 17, of the two neighboring memory cells 339 in the Y-direction, only one pair of diagonally positioned control gates is electrically connected to a word line. The other two control gates are electrically connected to the respective word lines on each side of the particular word line.

The method of fabricating the double-bit non-volatile memory according to this invention has already been described. The structure and method of forming the double-bit non-volatile memory can be obtained from previous description and figures. However, to illustrate the method of operating the double-bit non-volatile memory structure of this invention and associated advantages, a memory cell 339 shown in FIGS. 11A and 12A is selected for further explanation. In the following, the bit line for connecting with the source/drain regions of the memory cell 339 and the via and word line for connecting with the control gate of the memory cell 339 are omitted to simplify description.

Figure 18:
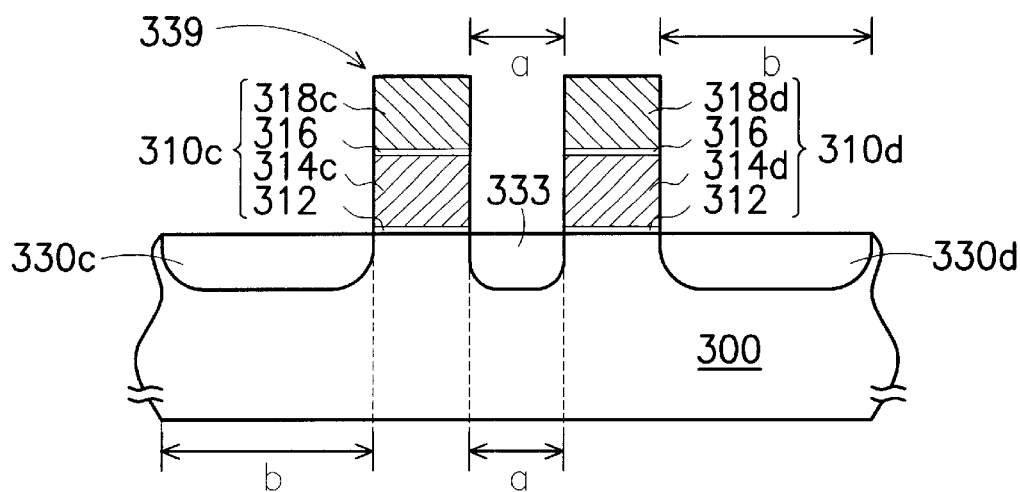
FIG. 18 is a schematic cross-sectional view of a typical non-volatile memory unit fabricated according to this invention.

FIG. 18 is a schematic cross-sectional view of a typical non-volatile memory unit fabricated according to this invention. As shown in FIG. 18, the memory cell 339 includes a pair of stacked gate structures 310c and 310d, a pair of source/drain regions 330c and 330c in the substrate 300 on each side of the pair of stacked gate structures 310c and 310d, and a doped region 333 in the substrate 300 between the stacked gate structure 310c and the stacked gate structure 310d. The stacked gate structure 310c(d) includes, from bottom to top, the tunnel oxide layer 312, the floating gate 314c(d), the inter-gate dielectric layer 316 and the control gate 318c(d). Both the source/drain region 330c(d) and the doped region 333 are doped identically with, for example, n-type dopants.

Figure 19:
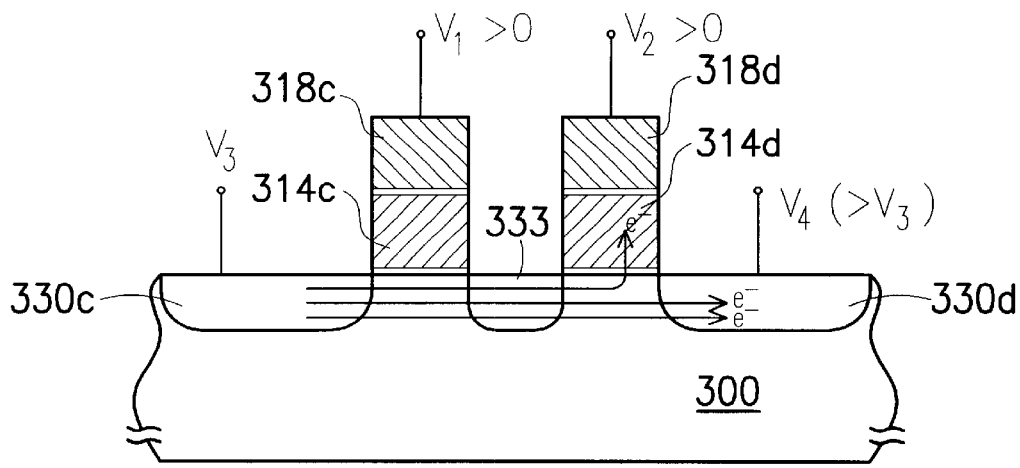
FIG. 19 is a schematic cross-sectional diagram of a non-volatile memory unit illustrating the method of programming of the non-volatile memory unit according to this invention.

FIG. 19 is a schematic cross-sectional diagram of a non-volatile memory unit illustrating the method of programming of the non-volatile memory unit according to this invention. Both the source/drain region 330c(d) and the doped region 333 are n-doped regions. The non-volatile memory unit operates by channel hot electron (CHE) injection. To operate the memory unit, a first bias voltage $V_1$, and a second bias voltage $V_2$ both higher than zero are applied to the control gate 318c and 318d, respectively, so that the channels respectively under the floating gate 314c and 314d are both opened. If data need to be written into the floating gate 314d, a bias voltage $V_3$ such as a ground voltage is applied to the source drain region 330c on one side of the control gate 318c. In the meantime, a bias voltage $V_4$ greater than $V_3$ is applied to the source/drain region 330d on one side of the control gate 318d to trigger the flow of electrons from the source/drain region 330c to the source/drain region 330d. Here, the difference in voltage between $V_4$ and $V_3$ must be sufficient to generate hot electrons capable of injecting into the floating gate 314d in the channel underneath floating gate 314d. However, the difference in voltage between $V_4$ and $V_3$ must not be so great as to cause the injection of hot electrons into the floating gate 314c.

Similarly, to write data into the floating gate 314c, polarity of the voltage applied to the two source/drain regions 330c and 330d is reversed when the channels respectively underneath the floating gates 314c and 314d are both opened. Hence, hot electrons are only generated in the channel underneath the floating gate 314c and injected into the floating gate 314c.

In addition to the hot channel injection method, the tunneling method can also be used. A high bias voltage is applied to the control gate 318c (or $d$) and a low bias voltage is applied to the source/drain region 330c (or $d$) on the same side. The difference between the high bias voltage and the low bias voltage must be large enough to initiate Fowler-Norheim tunneling from the source/drain region 330c (or $d$) into the floating gate 314c (or $d$).

Due to the presence of a negative charge, the threshold voltage (voltage needed to applied to the control gate 318c/d to open the channel) of the channel underneath the floating gate 314c and 314d is greater when the floating gates 314c and 314d are in the written state instead of the erased state. Here, the threshold voltage of the channel in the written state is labeled $V_{Twrite}$ and the threshold voltage of the channel in the erased state is labeled $V_{Terase}$, and $V_{Twrite} > V_{Terase}$.

Figure 20:
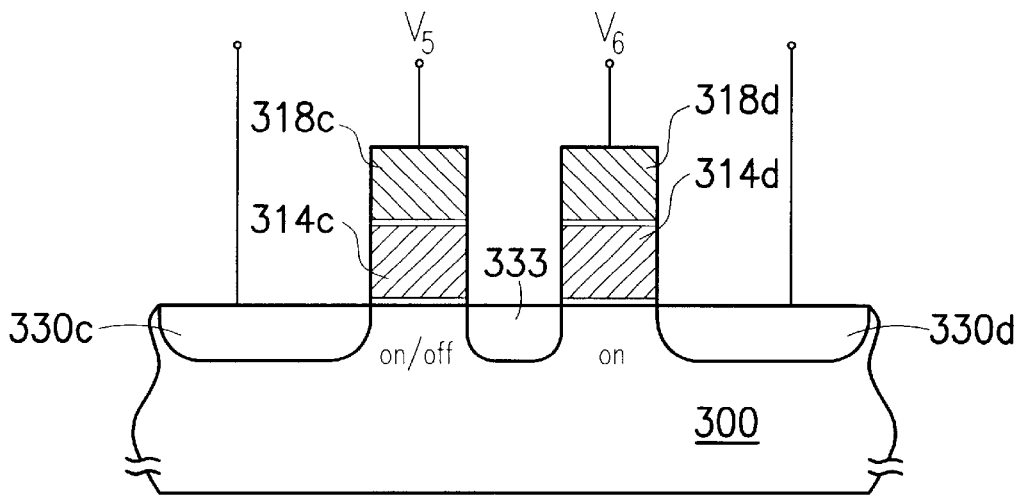
FIG. 20 is a schematic cross-sectional diagram of a non-volatile memory unit illustrating the method of reading data from the non-volatile memory unit according to this invention.

FIG. 20 is a schematic cross-sectional diagram of a non-volatile memory unit illustrating the method of reading data from the non-volatile memory unit according to this invention. Here, the process of reading data from the floating gate 314c is used as an example. As shown in FIG. 20, the process involves applying a bias voltage $V_6$ greater than the voltage $V_{Twrite}$ to the control gate 318d so that the channel underneath the floating gate 314d is opened. In the meantime, a bias voltage $V_5$ is applied to the control gate 318c. The relationship between various voltages is given by the inequality: $V_{Twrite} > V_5 > V_{Terase}$. Thereafter, difference bias voltages are applied to the source/drain regions 330c and 330d. Conductivity between the source/drain regions 330c and 330d are gauged to determine if the floating gate 314c contains a bit of written data.

Due to the voltage at the control gate 318d $V_6 > V_{Twrite} > V_{Terase}$, the channel underneath the floating gate 314d is open no matter if data is written into the floating gate 314d or not. On the other hand, the control gate 318c voltage $V_5$, $V_{Terase}$ and $V_{Twrite}$ is given by the relationship $V_{Twrite} > V_5 > V_{Terase}$. The channel is opened when the floating gate 314c is in the erased state and the channel is closed when the floating gate 314c is in the written state. Since the doped region 333 is n-doped, conduction between the source/drain regions 330c and 330d indicates the floating gate 314c is in the erased state. Conversely, non-conduction between the source/drain regions 330c and 330d indicates the floating gate 314c is in the written state.

Figure 2:
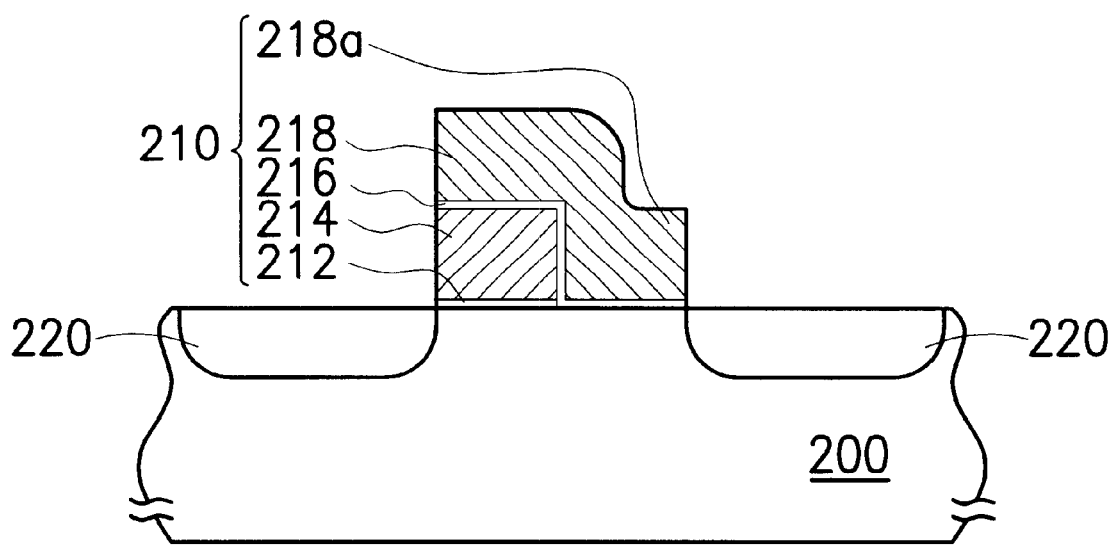
FIG. 2 is a schematic cross-sectional view of a non-volatile cell having a conventional split-gate structure.

Each memory cell of the double-bit non-volatile memory structure fabricated according to the two embodiments of this invention comprises of a pair of stacked gate structures 310c and 310d, both using a pair of source/drain regions 330c and 330d. Therefore, the source/drain regions 330c and 330d are conductive only when the channel underneath both the floating gates 314c and 314d are opened. Because the probability of having both floating gate 314c and 314d over-erased at the same time is small, the probability of maintaining a conductive condition between the source/drain regions 330c and 330d is also small. Compared with a conventional stacked gate design, the possibility of misjudging data in the memory cell is greatly reduced. In addition, one of the stacked gate structures within a memory cell can prevent judgment error due to an over-erased condition occurring in the other stacked gate structure. Hence, the stacked gate structure in this invention can also be regarded as a transfer gate having a function similar to the transfer gate 218a shown in FIG. 2.

In addition, any memory cell in the double-bit non-volatile memory of this invention has a pair of floating gate for holding two data bits. Moreover, a stacked gate structure is used as a transfer gate to prevent problems caused by over-erasure in the other stacked gate structure. Hence, unlike a conventional split-gate structure 210 having the transfer gate 218a fabricated next to the control gate 218, each memory cell can occupy a smaller area.

Furthermore, the control gate 318a and the floating gate 314a are patterned consecutively as shown in FIG. 9 and 9A. Moreover, a stacked gate structure 310c (or d) is used as a transfer gate for preventing problems caused by over-erasure in the floating gate 314d (or c) as shown in FIG. 18. Consequently, unlike a convention split gate structure, there is no need to conduct two separate photolithographic operations to pattern the floating gate and the control gate/transfer gate. In addition, the photolithographic method used in this invention is a self-aligned process. Hence, non-uniformity of electrical properties in the device is greatly minimized.

As shown in FIG. 19, the doped region 333 in the double-bit non-volatile memory serves only as a current route. Therefore, as long as the doped region 333 and the source/drain regions 330a and 330b are doped identically, width 'a' of the doped region 333 can be smaller than width 'b' of the source/drain regions 330a and 330b. Ultimately, when compared with the conventional stacked gate structure shown in FIG. 1, the double-bit non-volatile memory of this invention uses a smaller area to hold a bit of data.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A double-bit non-volatile memory structure, comprising:

a substrate;

a plurality of isolation lines on the substrate;

a plurality of bit lines on the substrate running in a direction perpendicular to the isolation lines, wherein the bit lines and the isolation lines cross each other to form a plurality of grid units;

a plurality of stacked gate structures with a pair of stacked gate structures within each grid unit forming a group, wherein connecting lines leading to the pair of stacked gate structures within each grid unit run in a direction parallel to the isolation lines, and each stacked gate structure has a floating gate and a control gate above the floating gate;

a plurality of doped regions in the substrate, wherein each doped region is located in an area between the pair of stacked gate structures within a grid unit;

a plurality of source/drain regions in the substrate, wherein each source/drain region is located in an area between neighboring grid units and is electrically connected to the respective bit lines, and the source/drain regions and the doped regions are doped identically; and a plurality of word lines above the stacked gate structures running in a direction parallel to the bit lines, wherein each of the two control gates within a grid unit are electrically connected to a different neighboring word line.

2. The structure of claim 1, wherein the double-bit non-volatile memory includes a flash memory.

3. The structure of claim 1, wherein the bit lines are a plurality of buried bit lines in the substrate formed by doping and each source/drain region is a portion of the buried bit line.

4. The structure of claim 1, wherein the bit lines run across the isolation lines and connect electrically with the source/drain regions.

5. The structure of claim 4, wherein the two stacked gate structures within the same grid unit are separated by a first distance and are laid in a direction parallel to the isolation lines, the two stacked gate structures belonging to neighboring grid units are separated by a second distance, and the first distance is smaller than the second distance; and the area between the two stacked gate structures within each grid unit is covered by an insulation layer, outer sidewalls of the two stacked gate structure are covered by a spacer, and a material forming the spacers is identical to a material forming the insulation layer.

6. The structure of claim 4, wherein material forming the bit lines includes polysilicon.

7. The structure of claim 4, wherein material forming the bit lines includes metal.

8. The structure of claim 1, wherein each word line passes by neighboring rows of grid units and connects electrically with one of the two control gates within each grid unit, and only a pair of control gates in a same row out of a pair of grid units in a same row connects electrically with a word line.

9. The structure of claim 8, wherein the pair of control gate in a same row is electrically connected to the word line via an unlanded via.

10. The structure of claim 8, wherein among the grid units along two neighboring rows, each control gate that connects electrically with a word line are located on a same side as the grid unit that they belong.

11. The structure of claim 1, wherein each word line passes by neighboring rows of grid units and connects electrically with one of the two control gates inside the grid unit on both neighboring rows, and only a pair of diagonally positioned control gates among a pair of grid units in a same row connects electrically with a word line.

12. The structure of claim 11, wherein each control gate is electrically connected to the word line by a landed via.

13. The structure of claim 11, wherein the grid units along one row of a pair of neighboring rows and each control gate that connects electrically with a word line are located on a first side of various grid units that they belong to; and the grid units along a second row of the pair of neighboring rows and each control gate that connects electrically with a word line are located on a second side of various grid units that they belong to.

14. The structure of claim 1, wherein both the doped regions and the source/drain regions are n-doped regions.

* * * * *